(12) United States Patent
Fukuchi

(10) Patent No.: US 7,202,155 B2
(45) Date of Patent: Apr. 10, 2007

(54) METHOD FOR MANUFACTURING WIRING AND METHOD FOR MANUFACTURING SEMICONDUCTOR DEVICE

(75) Inventor: Kunihiko Fukuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 198 days.

(21) Appl. No.: 10/911,815

(22) Filed: Aug. 5, 2004

(65) Prior Publication Data
US 2005/0037614 A1    Feb. 17, 2005

(30) Foreign Application Priority Data
Aug. 15, 2003    (JP) .............................. 2003-294021

(51) Int. Cl.
*H01L 21/4763* (2006.01)
*H01L 21/44* (2006.01)

(52) U.S. Cl. ................ 438/622; 438/666; 257/E21.538

(58) Field of Classification Search ................ 438/106, 438/125, 126, 127, 584, 597, 612, 618, 622, 438/666, 669, 674
See application file for complete search history.

(56) References Cited

U.S. PATENT DOCUMENTS

| | | | |
|---|---|---|---|
| 5,117,299 A | 5/1992 | Kondo et al. | 359/58 |
| 5,132,676 A | 7/1992 | Kimura et al. | 340/784 |
| 5,240,801 A | 8/1993 | Hayashi et al. | 430/57 |
| 5,330,616 A | 7/1994 | Yamazaki | 156/643 |
| 5,583,369 A | 12/1996 | Yamazaki et al. | 257/635 |
| 5,592,318 A | 1/1997 | Majima et al. | 349/122 |
| 5,652,667 A | 7/1997 | Kurogane | 349/42 |
| 5,706,067 A | 1/1998 | Colgan et al. | 349/114 |
| 5,739,890 A | 4/1998 | Uda et al. | 349/156 |
| 5,754,263 A | 5/1998 | Akiyama et al. | 349/110 |
| 5,757,054 A | 5/1998 | Miyawaki et al. | 257/390 |
| 5,767,827 A | 6/1998 | Kobayashi et al. | 345/87 |
| 5,910,271 A | 6/1999 | Ohe et al. | 252/299.01 |
| 5,933,204 A | 8/1999 | Fukumoto | 349/43 |
| 5,946,561 A | 8/1999 | Yamazaki et al. | 438/166 |

(Continued)

FOREIGN PATENT DOCUMENTS

JP    08-204008    8/1996

(Continued)

OTHER PUBLICATIONS

Pending U.S. Appl. No. 10/809,762 filed Mar. 25, 2004 to Imai, including specification, claims, abstract, drawings and PTO filing receipt.

*Primary Examiner*—Scott B. Geyer
(74) *Attorney, Agent, or Firm*—Cook, Alex, McFarron, Manzo, Cummings & Mehler, Ltd.

(57) ABSTRACT

The present invention provides a method for manufacturing a wiring and a method for manufacturing a semiconductor device, which do not require a photolithography step in connecting a pattern of an upper layer and a pattern of a lower layer. According to the present invention, a composition including a conductive material is discharged locally and an electric conductor to function as a pillar is formed on a first pattern over a substrate, an insulator is formed to cover the electric conductor, the insulator is etched to expose a top surface of the electric conductor, and a second pattern is formed on the top surface of electric conductor that is exposed.

32 Claims, 11 Drawing Sheets

U.S. PATENT DOCUMENTS

| | | |
|---|---|---|
| 5,949,107 A | 9/1999 | Zhang .................. 257/347 |
| 6,008,876 A | 12/1999 | Moore .................. 349/139 |
| 6,037,197 A | 3/2000 | Yamazaki et al. ......... 438/151 |
| 6,049,132 A | 4/2000 | Iwahashi et al. ......... 257/763 |
| 6,294,815 B1 | 9/2001 | Yamazaki et al. ......... 257/350 |
| 6,326,249 B1 | 12/2001 | Yamazaki et al. ......... 438/158 |
| 6,468,844 B1 | 10/2002 | Yamazaki et al. ......... 438/156 |
| 6,556,264 B1 | 4/2003 | Hirakata et al. ......... 349/110 |
| 6,670,106 B2 | 12/2003 | Fujio .................. 430/322 |
| 6,794,229 B2 | 9/2004 | Asami et al. |
| 6,953,951 B2 | 10/2005 | Yamazaki et al. |
| 7,061,570 B2 | 6/2006 | Imai |
| 2001/0033998 A1 | 10/2001 | Fujio .................. 430/322 |
| 2002/0046880 A1* | 4/2002 | Takubo et al. ............ 174/261 |
| 2003/0054653 A1 | 3/2003 | Yamazaki et al. ......... 438/694 |
| 2003/0193627 A1 | 10/2003 | Hirakata et al. ......... 349/43 |
| 2004/0124516 A1* | 7/2004 | Nakamura et al. ......... 257/685 |
| 2004/0218136 A1* | 11/2004 | Imai .................. 349/156 |

FOREIGN PATENT DOCUMENTS

| | | |
|---|---|---|
| JP | 10-303428 | 11/1998 |
| JP | 2001-267230 | 9/2001 |
| JP | 2002-359246 | 12/2002 |

* cited by examiner

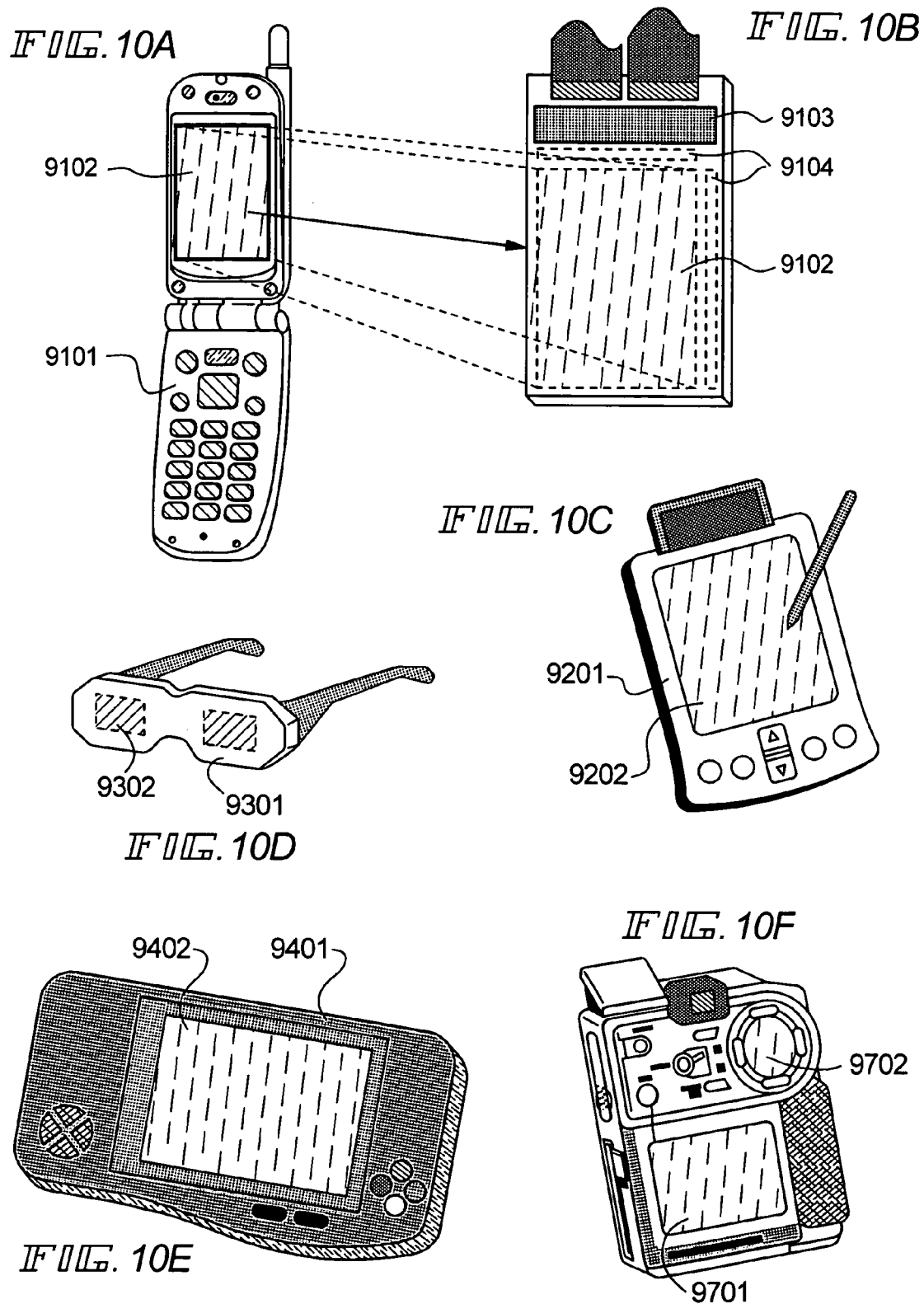

METHOD FOR MANUFACTURING WIRING AND METHOD FOR MANUFACTURING SEMICONDUCTOR DEVICE

BACKGROUND OF THE INVENTION

1. Field of the Invention

The present invention relates to a method for manufacturing a wiring and a method for manufacturing a semiconductor device by using a droplet discharging method. Specifically, the present invention relates to a method for manufacturing a wiring forming a conductor to function as a pillar and a method for manufacturing a semiconductor device so as to connect a pattern of an upper layer with a pattern of a lower layer by a droplet discharging method.

2. Description of the Related Art

In recent years, pattern formation by a droplet discharging method (such as ink-jetting) is applied to a field of a flat panel display and developed actively. A droplet discharging method is applied in manufacturing an EL layer, a color filter, an electrode of a plasma display, and the like, since it has a great number of advantages that a mask is unnecessary because directly drawing is possible, the method can be easily applied to a large substrate, the usability of a material is high, and the like.

A process using a droplet discharging method has a great advantage that a mask is unnecessary. However, when a contact of a lower layer and an upper layer is made, a contact hole or a metal cylinder to function as a pillar needs forming; therefore a sequence of photolithography steps such as light-exposure and development is required.

As a forming method of a pillar having a highly accurate and favorable shape, for example, there is a method by which an opening portion formed in a photoresist layer is filled with a nonphotosensitive organic resin film, and the nonphotosensitive organic resin film on the photoresist layer is entirely etched back until the photoresist layer is exposed, the photoresist layer is removed by exposing the entire surface thereof to light and developing it, and thus, a nonphotosensitive organic resin film having a desired shape is obtained (Reference 1: Japanese Patent Laid-Open No. 2001-267230. First page, FIG. 1)

When a photolithography step is employed like Reference 1, the number of steps increases, and thus, the yield decreases.

SUMMARY OF THE INVENTION

In view of the above mentioned problems, it is an object of the present invention to provide a method for manufacturing a wiring and a method for manufacturing a semiconductor device, which do not require a photolithography step in connecting a pattern of an upper layer and a pattern of a lower layer.

Means hereinafter are taken in the present invention to solve the problems of the related art.

A method for manufacturing a wiring of the present invention comprises the steps of: discharging a composition including a conductive material locally and forming an electric conductor to function as a pillar so as to be in contact with a first pattern over a substrate; forming an insulator to cover the electric conductor; etching the insulator to expose the electric conductor; and forming a second pattern to be in contact with the electric conductor that is exposed. The manufacturing steps are shown in FIGS. 1A to 1D.

A method for manufacturing a semiconductor device of the present invention, comprises the steps of: discharging a composition including a conductive material locally and forming an electric conductor to function as a pillar so as to be in contact with an impurity region included in a semiconductor; forming an insulator to cover the electric conductor; etching the insulator to expose the electric conductor; and forming a pattern to be in contact with the electric conductor that is exposed.

A method for manufacturing a semiconductor device of the present invention, comprises the steps of: forming a semiconductor including one conductivity type impurity to be in contact with a first pattern; laminating a first insulator and a semiconductor to be in contact with the semiconductor including one conductivity type impurity; forming a second pattern by discharging a composition to be in contact with the first insulator; patterning the semiconductor including one conductivity type impurity, the semiconductor and the first insulator simultaneously by using the second pattern as a mask, and thereafter, removing the second pattern; discharging a composition including a conductive material locally and forming an electric conductor to function as a pillar so as to be in contact with the first pattern over a substrate; forming a second insulator to cover the electric conductor; etching the second insulator to expose the electric conductor; and forming a third pattern to be in contact with the electric conductor that is exposed. The semiconductor is an amorphous semiconductor and the steps are shown in FIGS. 2A to 2E.

A method for manufacturing a semiconductor device of the present invention, comprises the steps of: forming a first pattern to be in contact with a first insulator formed over a semiconductor; adding an impurity into the semiconductor by using the first pattern as a mask; discharging a composition including a conductive material locally and forming an electric conductor to function as a pillar so as to be in contact with an impurity region included in the semiconductor; forming a second insulator to cover the electric conductor; etching the second insulator to expose the electric conductor; and forming a second pattern to be in contact with the electric conductor that is exposed. The semiconductor is a polycrystalline semiconductor and the steps are shown in FIGS. 3A to 3E.

In the above mentioned method for manufacturing a wiring and method for manufacturing a semiconductor device, a composition is discharged by a droplet discharging unit. The droplet discharging unit corresponds to a nozzle provided with an outlet, and a head equipped with one nozzle or a plurality of nozzles. The nozzle is equipped with a piezoelectric element or a heater that makes a heat-generator develop heat to generate a bubble, and pushes out a solution. An electric conductor is formed by locally discharging and depositing the composition with the droplet discharging unit. This electric conductor is preferably formed to be cylindrical. The composition discharged from the outlet is one in which a conductive material such as silver, gold, copper or indium tin oxide is dissolved or dispersed in a solvent. In addition, an insulator that is formed to cover the electric conductor is etched by an etchback method or a CMP method. The insulator is formed by discharging a composition including resin.

One feature of the present invention is that an electric conductor is formed by a droplet discharging method, in manufacturing a wiring for connecting upper and lower patterns by forming an electric conductor functioning as a pillar for connecting with a pattern of an upper layer is formed on a pattern of a lower layer. According to the present invention, the upper and lower patterns can be connected with each other without forming a contact hole.

Therefore, enhancement of yield is realized since the steps such as resist coating, light-exposure, development, postbake, and etching, for example, that are required in forming a contact hole can be eliminated.

These and other objects, features and advantages of the present invention become more apparent upon reading of the following detailed description along with the accompanying drawings.

BRIEF DESCRIPTION OF THE DRAWINGS

In the accompanying drawings:

FIGS. 10A to 10F show electronic devices to which the present invention is applied.

DETAILED DESCRIPTION OF THE INVENTION

Figure 1A:
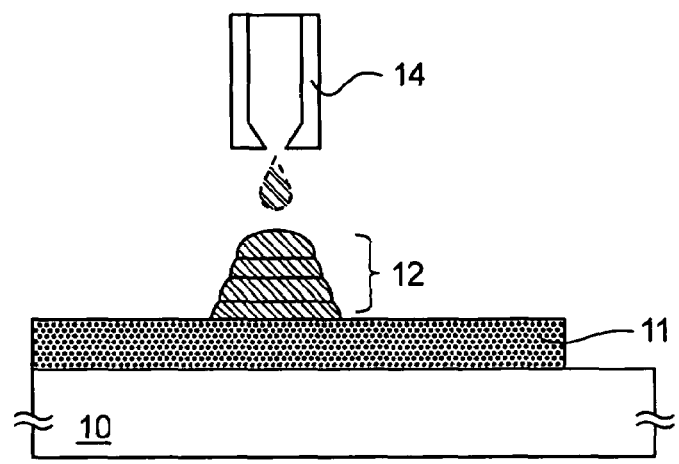
FIGS. 1A to 1D show a method for manufacturing a wiring of the present invention.

Embodiment Modes of the present invention are described with reference to drawings in detail. In the structures of the present invention to be described hereinafter, the same reference numerals showing the same elements are used commonly in different drawings.

[Embodiment Mode 1]

A method for manufacturing a wiring of the present invention is described with reference to FIGS. 1A to 1D.

A glass substrate formed of a barium borosilicate glass, an alumino borosilicate glass or the like, a quartz substrate, a silicon substrate, a metal substrate, a stainless substrate or a plastic substrate having heat resistance that can resist the treatment temperature in the manufacturing steps is used as a substrate 10. (FIG. 1A). A base film made of an insulator is formed on the substrate 10 if necessary. Then, a pattern 11 formed from an electric conductor (conductor) or a semiconductor is formed over the substrate 10 by a known method such as a sputtering method, a vapor deposition method, a CVD method or a droplet discharging method.

Then, an electric conductor 12 functioning as a pillar is formed to be in contact with the pattern 11 by locally discharging a composition including a conductive material by a droplet discharging unit 14. It is preferable that this electric conductor 12 is formed to be cylindrical by depositing the discharged composition. This is because a pattern of a lower layer is easily contacted with a pattern of an upper layer by using the cylindrical electric conductor 12. Note that FIG. 1A shows a mode of the deposited composition.

The term "cylindrical" is a solid shape surrounded by three planes, namely, a plane of a column shape and two planes that intersect with the bus bar and that are parallel with each other (hereinafter, referred to as a first plane and a second plane). In many cases, the first plane and the second plane have the same circle shape. However, the term "cylindrical" in the present invention includes a case where the shape of the first plane is different from that of the second plane. As a practical matter, in the electric conductor 12 formed by a droplet discharging method, the area of the first plane of the lower layer is formed to be larger than that of the second plane of the upper layer. It is preferable in forming the cylindrical electric conductor 12 that the diameter of the upper plane thereof is 0.01 to 10 μm (preferably, 0.1 to 5 μm), the diameter of the lower plane thereof is 0.1 to 100 μm (preferably, 1 to 10 μm), and the height thereof is 0.05 to 5 μm (preferably 0.1 to 3 μm). Note that the diameter or height expressing the electric conductor 12 greatly depends on a material of patterns of the lower and upper layers or a condition for discharging.

In addition, the shape of the electric conductor 12 may be a shape that makes a contact between the upper pattern and the lower pattern possible, without being limited to a cylindrical shape. For example, it may be formed to have a circular cone like, cube like, rectangular solid like, cylinder like (tube like), circular cylinder like or corner cylinder like shape. It is described above that the diameter or height of the electric conductor 12 depends on various parameters such as a material of the pattern 11 of the lower layer and a condition of discharging a composition. For example, the height of the electric conductor 12 depends on the material of the pattern 11 of the lower layer. Specifically, it depends on whether the material of the pattern 11 is hydrophilic or hydrophobic. In other words, it depends on the contact angle of the material of the pattern 11. For example, the height in depositing is obtained with a sequence of W/TaN>a-Si>p-Si>SiON, in the case where a composition in which silver (Ag) is dissolved or dispersed in a tetradecane solvent is used for the electric conductor 12 and four materials, that is, a lamination (W/TaN) of tantalum nitride (TaN) and tungsten (W), an amorphous semiconductor (a-Si), a polycrystalline semiconductor (p-Si), and silicon oxynitride (SiON) are used for the pattern 11 of the lower layer. Therefore, in order to form the electric conductor 12 having a favorable shape in which the diameters of an upper plane and a lower plane of the cylindrical electric conductor 12 are small and the height is large, a discharging speed of the composition may be lowered and viscosity of the composition may be changed by changing the discharging condition. In addition, the height of the electric conductor 12 may be adjusted by repeating discharging one drop or a plurality drops of the composition and a heat treatment after discharging.

The droplet discharging unit 14 for drawing a pattern is a generic term of a unit having means for discharging a droplet, and specifically, corresponds to a nozzle having an outlet for a composition or a head equipped with one nozzle or a plurality of nozzles. The diameter of the nozzle of the droplet discharging unit 14 may be set 0.02 to 100 μm (preferably, 30 μm or less), and the quantity of the composition discharged from the nozzle may be set 0.001 pl to 100 pl (preferably, 10 pl or less). The quantity to be discharged increases in proportion to the size of the diameter of the nozzle. The diameter of the nozzle may be appropriately changed according to a desired diameter of the electric conductor 12. Further, the distance between an object and an outlet of a nozzle is preferably as small as possible to drop at a desired position, and it is set about 0.1 to 3 mm (preferably, 1 mm or less).

As for the composition discharged from an outlet, a material in which an electric conductor is dissolved or dispersed in a solvent is used. The electric conductor may be a metal such as silver (Ag); gold (Au); copper (Cu); nickel (Ni); platinum (Pt); palladium (Pd); iridium (Ir); rhodium (Rh); tungsten (W); aluminum (Al), nanoparticles of silver halide or dispersive nanoparticles. Alternatively, it is indium tin oxide (ITO), organic indium, organic tin, zinc oxide (ZnO), titanium nitride (TiN) or the like that is used as a transparent conductive film. However, the composition discharged from an outlet is preferably one in which a material of gold, silver, or copper is dissolved or dispersed in a solvent in consideration of specific resistance value. It is further preferable that silver or copper having lower resistance is used. In the case of using copper, a barrier film may be also provided as a measure for impurities. The solvent is esters such as butyl acetate and ethyl acetate, alcohols such as isopropyl alcohol and ethyl alcohol, organic solvents such as methyl ethyl ketone and acetone or the like. Preferably, the viscosity of the composition is set to 50 cp or less such that dryness is prevented or the composition is smoothly discharged from an outlet. The surface tension of the composition is preferably 40 MN/m or less. The viscosity of the composition to be used and the like may be appropriately adjusted in accordance with a used solvent and the intended use. For example, the viscosity of a composition in which ITO, organic indium, or organic tin is dissolved or dispersed in a solvent is 5 to 50 mPa·S, the viscosity of a composition in which silver is dissolved or dispersed in a solvent is 5 to 20 mPa·S, and the viscosity of the composition in which gold is dissolved or dispersed in a solvent is 10 to 20 mPa·S.

The diameter of a particle of an electric conductor is preferably as small as possible for the purpose of preventing clogged nozzles and of manufacturing a highly fine pattern, although it depends on the diameter of each nozzle and a desired shape of a pattern. Preferably, the diameter of the particle is 0.1 μm or less. The composition is made by a known method such as electrolyzing, atomizing, and wet reducing, and the particle size thereof is typically about 0.5 to 10 μm. However, in the case of using a gas evaporation method, each nanometer molecular protected with a dispersing agent is minute and is about 7 nm in size. Further, when each surface of the nanometer particles is covered with a coating material, the nanometer particles among the solvent do not aggregate but are uniformly dispersed in the solvent at a room temperature, and show a property similar to that of aqueous fluid. As a result, a coating material is preferably used.

When the step of discharging a composition is performed under reduced pressure, the solvent of the composition is volatile during a period from discharging a composition till attaching it to an object, and thus, steps of drying and baking can be both eliminated. It is preferable that the step is performed under reduced pressure, since an oxide film is not formed on the surface of the electric conductor.

After discharging the composition, one or both of drying and baking is/are performed. Drying and baking are each a step of heat treatment. For example, drying is conducted for three minutes at 100° C. and baking is conducted for 15 to 30 minutes at temperatures from 200 to 350° C., and the purposes, temperatures and time of them are different. The steps of drying and baking are performed at a normal pressure or under reduced pressure by laser light irradiation, rapid thermal annealing, heating furnace or the like. Note that this heat treatment may be performed after forming the electric conductor 12 or after forming an insulator over the electric conductor 12, and thus, the timing is not limited particularly. The substrate may be heated so as to favorably perform the steps of drying and baking. The temperature at the time depends on a material of the substrate or the like, but it is generally 100 to 800° C. (preferably, 200 to 350° C.). By the steps, nanoparticles are in contact with one another and fusing together and fusing bond are accelerated by hardening and shrinking resin in the periphery as well as volatilizing solvent in a composition or removing a dispersing agent chemically.

A continuous wave or pulsed gas laser or solid state laser may be used for laser light irradiation. An excimer laser, a YAG laser, and the like are cited for the former gas laser, while lasers using crystals of YAG, YVO$_4$ doped with Cr, Nd or the like are cited for the latter solid state laser. Note that a continuous wave laser is preferably used in relation to an absorption factor of laser light. Alternatively, a so-called hybrid laser irradiation method combining a pulsed oscillation and a continuous wave may be employed. However, a heat treatment by irradiation of laser light may be instantaneously performed for several microseconds to several tens seconds in order not to destroy the substrate 10, according to heat resistance of the substrate 10. Rapid thermal annealing (RTA) is performed by instantaneously heating for several microseconds to several minutes by rapidly raising the temperature with an infrared lamp, a halogen lamp or the like that emits ultraviolet light to infrared light in an inert gas atmosphere. This treatment is performed instantaneously, and thus, a thin film on the top surface alone is substantially heated not to influence on a film under it. The substrate 10 that is weak in heat resistance is not influenced.

Figure 1B:
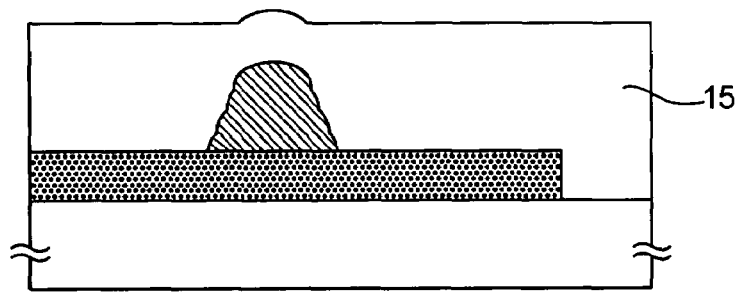

Next, an insulator 15 is formed to cover the electric conductor 12 functioning as a pillar (FIG. 1B). More specifically, the insulator 15 is formed over the entire surface of the substrate 10 with the thickness of 50 nm to 5 μm (preferably, 100 nm to 2 μm) to cover the electric conductor 12 by using a known method such as plasma CVD, a sputtering method, a SOG (Spin On Glass) method, a spin coating method or a droplet discharging method. The insulator 15 is formed with a single layer or a laminated layer of an insulating film including silicon such as a silicon oxide film, a silicon nitride film, a silicon nitride oxide film and a silicon oxynitride film. However, it is preferable that a material having low dielectric constant is employed (preferably, a material having relative dielectric constant of 4 or less) in terms of a wiring capacity, and, for example, an organic material such as acryl, benzocyclobutene, parylene, flare or light-transmitting polyimide may be used. It is preferable that an organic material is used for the insulator 15, since excessive film-thinning or disconnection in a step portion is not caused when an electric conductor is formed later, because of the favorable planarity. In addition, when a material having low dielectric constant is used for an interlayer insulating film, a wiring capacity is reduced, and thus, it is possible to form a multilayer wiring and to provide a semiconductor device that can realize high performance and high function. A barrier film may be formed by using a material such as titanium (Ti), titanium nitride (TiN), a silicide film such as titanium silicide (TiSix) or molybdenum silicide (MoSix), a polysilicon film, niobium (Nb), titanium oxynitride (TiON), tungsten (W), nitride tungsten (WN), titanium tungsten nitride (TiWN), tantalum (Ta) for the purpose of preventing degassing or the like in the case of using an organic material as the insulator 15. The barrier film may have a single layer structure or a laminated structure. It is possible to enhance adhesiveness, easily embed, reduce contact resistance and give stabilization, by the barrier film.

Figure 1C:
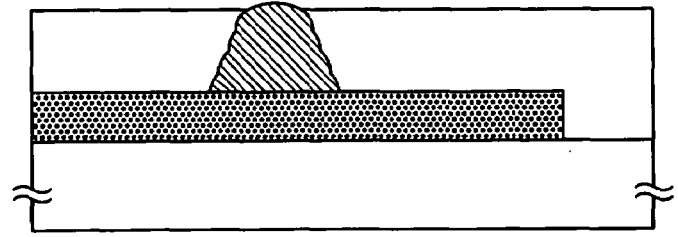

Next, the insulator 15 is etched to expose the electric conductor 12 functioning as a pillar. (FIG. 1C). More specifically, the insulator 15 is etched by either an etchback method or a CMP method (chemical mechanical polishing) so that a tip of the electric conductor 12 is exposed. This step is a step of flattening the surface by removing a convex portion made by forming the insulator 15 on the electric conductor 12. At this time, the insulator 15 is etched until not only the convex portion is removed but also the top surface of the electric conductor is exposed.

Figure 1D:
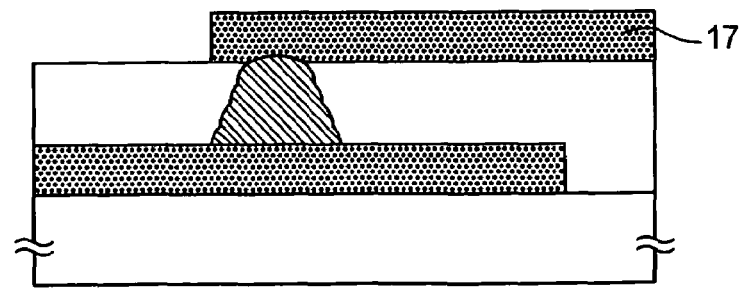

Then, a pattern 17 made of an electric conductor or a semiconductor is formed to be in contact with the exposed electric conductor 12 by a known method (FIG. 1D). By the above described steps, the pattern 11 and the pattern 17 can be connected to each other by providing the electric conductor 12 functioning as a pillar for connecting with the pattern 17, over the pattern 11.

Note that, in terms of tact time, it is desirable that one or both of the pattern 11 and the pattern 17 is/are formed by a droplet discharging method. This can be realized by exchanging a nozzle filled with a composition or exchanging a composition filled in a nozzle. In addition, enhancement of yield is realized, since a photolithography step using a mask is unnecessary when it is formed by a droplet discharging method.

The present invention by which the electric conductor 12 functioning as a pillar is formed by a droplet discharging method can make upper and lower patterns connect to each other without forming a contact hole. Therefore, enhancement of yield is realized, since steps required for forming a contact hole, such as resist coating, light-exposure, development, post-bake, and etching, can be omitted. Further, the present invention using a droplet discharging method can provide a process that contributes to a solution of an environmental issue, since the usability of a material drastically improves and the amount of waste solutions to be treated decreases. Moreover, a manufacturing process is simplified and the yield is enhanced, since a mask is unnecessary. In addition, according to the present invention, substrates from the so-called fifth generation substrate (one side is one meter or more) onward can be easily treated. Since a vacuum mechanism is not needed at a normal pressure, an effect of controlling increase of a foot print in a clean room is brought.

[Embodiment Mode 2]

A method for manufacturing a semiconductor device of the present invention is described with reference to FIGS. 2A to 2E, 3A to 3E and 4A and 4B.

Initially, a method for manufacturing a semiconductor device in which a bottom gate type thin film transistor using an amorphous semiconductor (a-Si) is manufactured and a wiring connected to the thin film transistor is formed according to the present invention is described with reference to FIGS. 2A to 2E, and FIG. 4A.

Figure 2A:
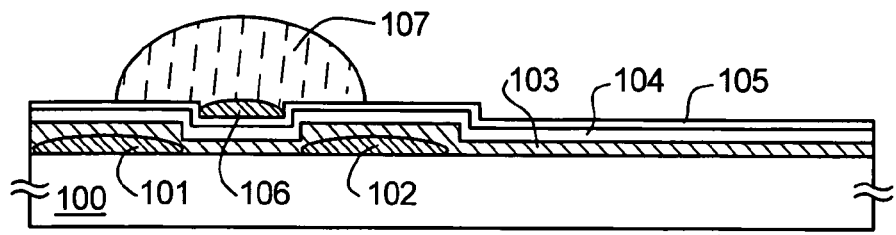
FIGS. 2A to 2E show a method for manufacturing of a semiconductor device of the present invention.
Figure 2B:
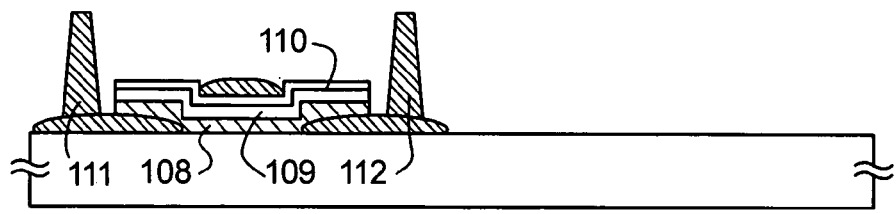

Electric conductors 101 and 102 are formed over a substrate 100 by a droplet discharging method, and then, an N type amorphous semiconductor 103, an amorphous semiconductor 104 and an insulator 105 are laminated to cover the electric conductors 101 and 102 (FIG. 2A). Then, an electric conductor 106 is formed over the insulator 105 by a droplet discharging method. At this time, a concave portion is formed in the insulator 105, and the accuracy of landing (the accuracy in discharging (dropping) a composition and attaching it to a desired portion) is improved by utilizing the concave portion as a bank, and thus, the electric conductor 106 can be formed in a desired portion. Next, a mask 107 made of an organic insulator such as polyimide or resist is formed and the N type amorphous semiconductor 103, the amorphous semiconductor 104 and the insulator 105 are patterned by using the mask 107 simultaneously to form an N type amorphous semiconductor 108, an amorphous semiconductor 109 and an insulator 110 (FIG. 2B).

Figure 2C:
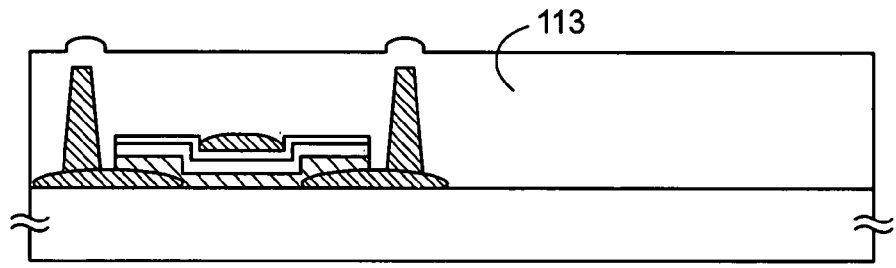
Figure 2D:
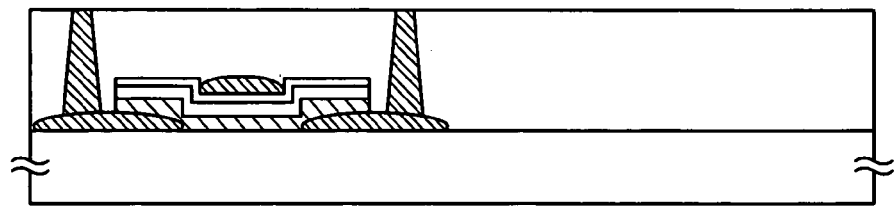
Figure 2E:
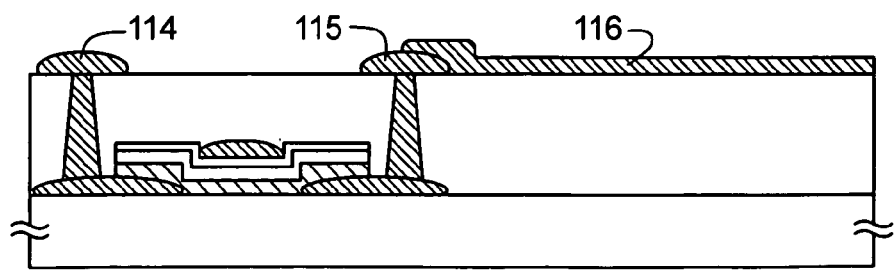

Subsequently, electric conductors 111 and 112 functioning as a pillar by a droplet discharging method are formed to be in contact with the electric conductors 101 and 102. At the time, it is preferable that the electric conductors 111 and 112 are formed to be cylindrical. Next, an insulator 113 is formed to cover the electric conductors 111 and 112 (FIG. 2C). Then, the insulator 113 is etched to expose the electric conductors 111 and 112 (FIG. 2D). At the time, the insulator 113 is etched to expose top surfaces of the electric conductors 111 and 112. Electric conductors 114 and 115 are formed to be in contact with the exposed top surfaces of electric conductors 111 and 112 (FIG. 2E). Herein, the electric conductors 114 and 115 are formed by a droplet discharging method. Through the above described steps, upper and lower patterns can be connected to each other by providing the electric conductors 111 and 112 for connecting with the electric conductors 114 and 115 over the electric conductors 101 and 102. The present invention including the above described steps can make upper and lower patterns connect to each other without forming a contact hole.

Figure 4A:
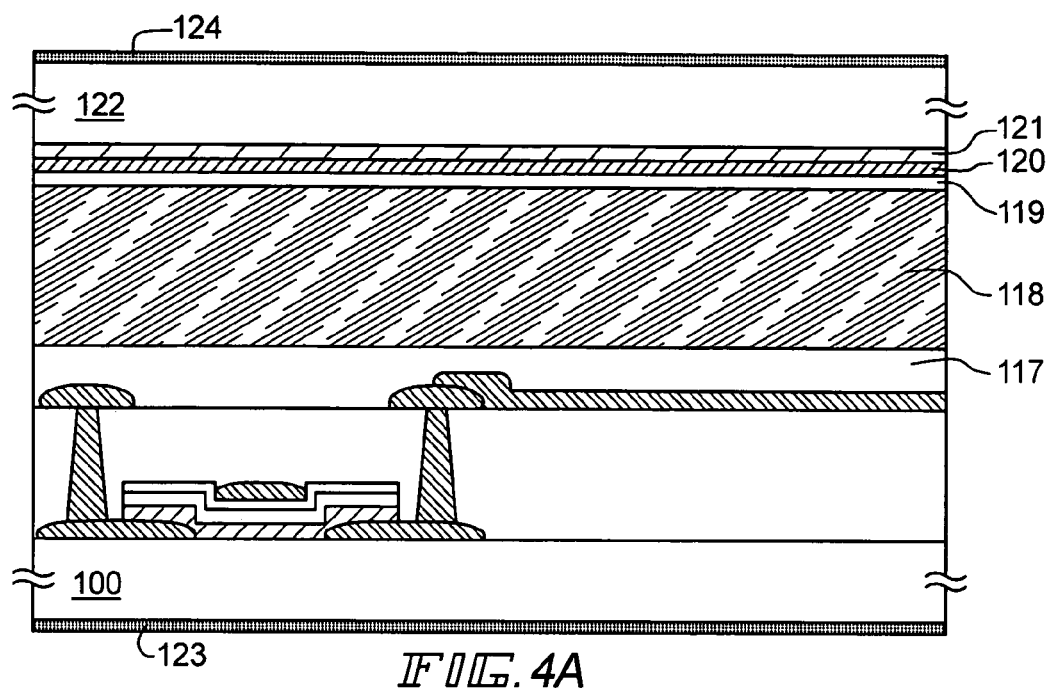
FIGS. 4A and 4B show a method for manufacturing of a semiconductor device of the present invention, specifically, a method for manufacturing of a semiconductor device having a display function.
Figure 4B:
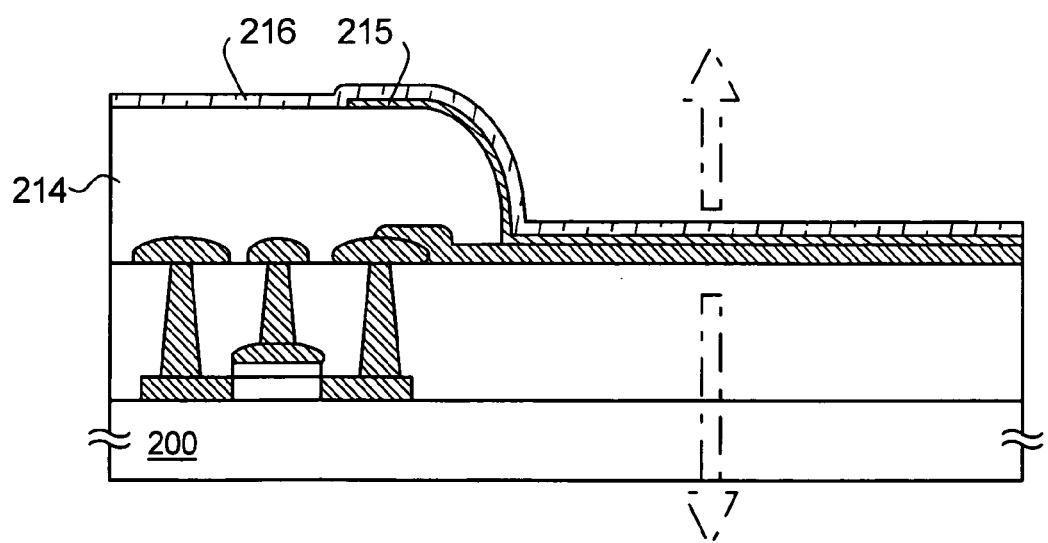

Next, an electric conductor 116 is formed to be in contact with the electric conductor 115. This electric conductor 116 functions as a pixel electrode later. Then, an orientation film 117 is formed over the electric conductor 116 (FIG. 4A). A substrate 122 over which a color filter 121, an opposite electrode 120 and an orientation film 119 are laminated is prepared, the substrates 100 and 122 are attached by heat hardening of a sealing portion (not shown), and thereafter, a liquid crystal 118 is injected to complete a semiconductor device equipped with a display function using a liquid crystal element. Polarizing plates 123 and 124 are attached to the substrates 100 and 122.

Next, a method for manufacturing a semiconductor device in which a top gate type thin film transistor using a polycrystalline semiconductor (p-Si) is manufactured and a wiring connected to the thin film transistor is formed according to the present invention is described with reference to FIGS. 3A to 3E, and FIG. 4B.

Figure 3A:
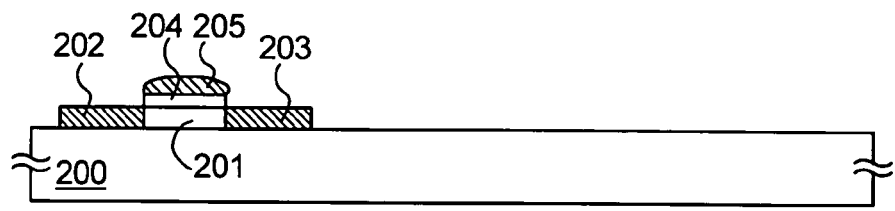
FIGS. 3A to 3E show a method for manufacturing of a semiconductor device of the present invention.
Figure 3B:
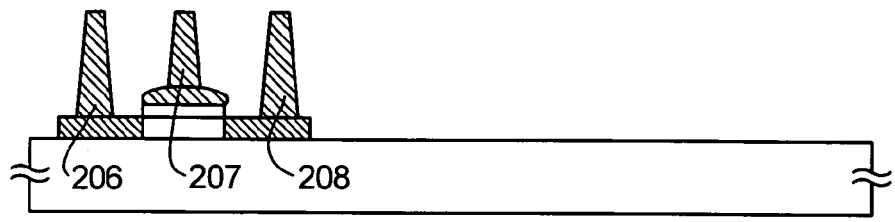
Figure 3C:
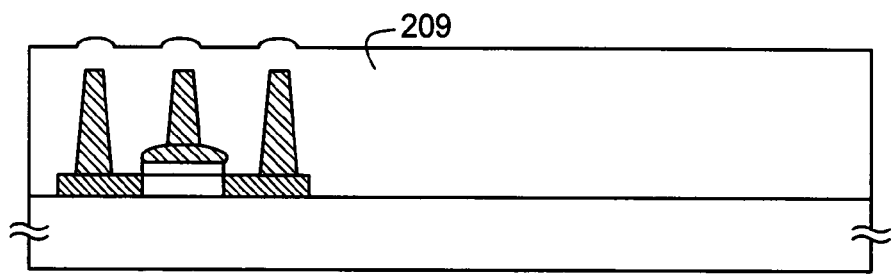

A semiconductor is formed over a substrate 200, and an insulator 204 is formed over the semiconductor. Thereafter, an electric conductor 205 is formed on the insulator 204 by a droplet discharging method (FIG. 3A). Then, impurity regions 202 and 203 doped with impurities and a channel forming region 201 are formed by adding impurities into the semiconductor with the electric conductor 205 as a mask. Electric conductors 206 to 208 functioning as a pillar are formed to be in contact with the impurity regions 202 and 203 and the electric conductor 205 by a droplet discharging method (FIG. 3B). At the time, it is preferable that the electric conductors 206 to 208 are formed to be cylindrical. An insulator 209 is formed to cover the electric conductors 206 to 208 (FIG. 3C).

Figure 3D:
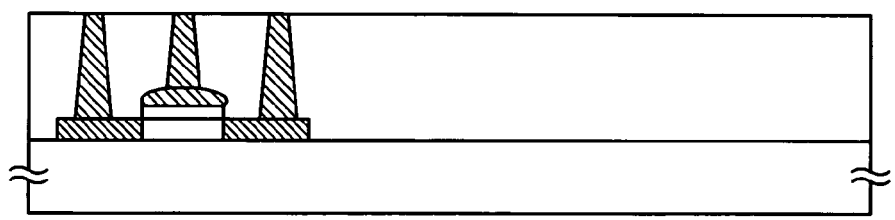
Figure 3E:
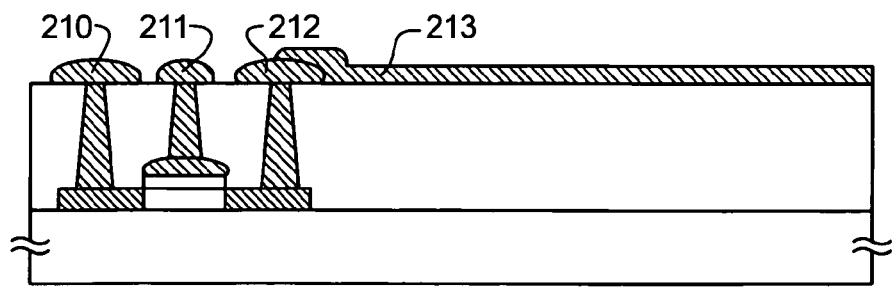

Then, the insulator 209 is etched to expose the electric conductors 206 to 208 (FIG. 3D). At the time, the insulator 209 is etched so that top surfaces of the electric conductors 206 to 208 are exposed. Next, electric conductors 210 to 212 are formed to be in contact with the exposed electric conductors 206 to 208 (FIG. 3E). Here, electric conductors 210 to 212 are formed by a droplet discharging method. Through the above described steps, upper and lower patterns are connected to each other by providing the electric conductors 206 to 208 functioning as a pillar for connecting with the electric conductors 210 to 212 over the impurity regions 202 and 203 and the electric conductor 205. The present invention having the above described steps can make upper and lower patterns connect to each other without forming a contact hole.

Next, an electric conductor 213 is formed to be in contact with the electric conductor 212. This electric conductor 213 functions as a pixel electrode later. An insulator 214 functioning as a bank is formed, and an electroluminescent layer 215 is formed on the insulator 214, and an electric conductor 216 is formed over electroluminescent layer 215. A lamination of the electric conductor 213, the electroluminescent layer 215 and the electric conductor 216 is equivalent to a light-emitting element. As for light emitted from the light-emitting element, there is a top emission in which light is emitted to the substrate side, a bottom emission in which light is emitted to the opposite side, and a dual emission in which light is emitted to both of the substrate side and the opposite side by forming a pair of electrodes from a transparent material, or with a thickness enough to transmit light. Either of them may be applied. Through the above described steps, a semiconductor device equipped with a display function using a light-emitting element is completed.

Subsequently, a method for manufacturing a semiconductor device in which a channel protecting type thin film transistor using an amorphous semiconductor is formed and a wiring connected to the thin film transistor is formed, according to the present invention, is described with reference to FIGS. 11A to 11D.

Figure 11A:
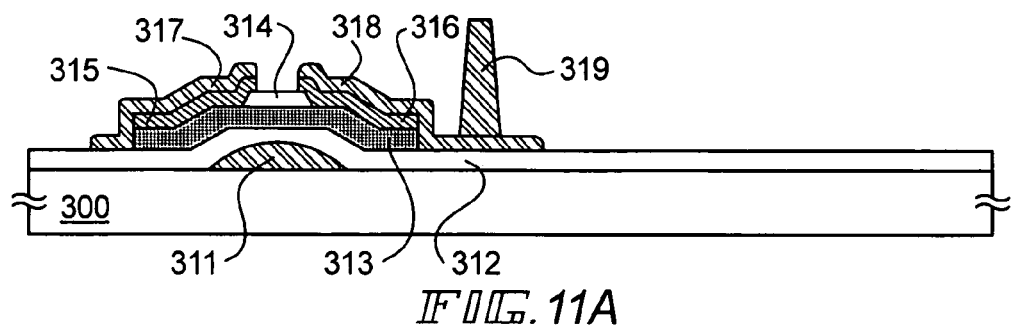
FIGS. 11A to 11D show a method for manufacturing a semiconductor device of the present invention.

An electric conductor 311 is formed on a substrate 300 and an insulator 312 is formed to cover the electric conductor 311 (FIG. 11A). Then, an amorphous semiconductor is formed over the entire surface, and an insulator is formed over the entire surface to cover the amorphous semiconductor. The insulator alone is patterned by using a mask to form an insulating layer 314 to serve as an etching stopper. An N type amorphous semiconductor is formed over the entire surface to cover the insulating layer 314, and then, the amorphous semiconductor and the N type amorphous semiconductor are simultaneously patterned with a mask to form an amorphous semiconductor layer 313 and N type amorphous semiconductor layers 315 and 316. Then, electric conductors 317 and 318 to be connected with the N type amorphous semiconductor layers 315 and 316 are formed.

Figure 11B:
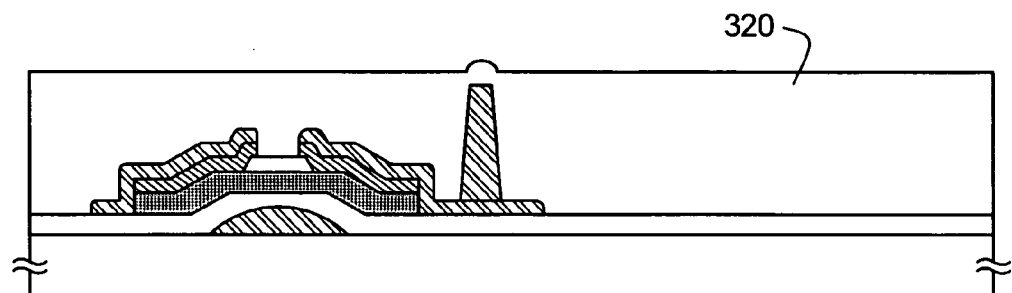

Next, an electric conductor 319 functioning as a pillar is formed to be in contact with the electric conductor 318 by a droplet discharging method. At the time, the electric conductor 319 is formed to be cylindrical. Next, an insulator 320 is formed to cover the electric conductor 319 (FIG. 11B).

Figure 11C:
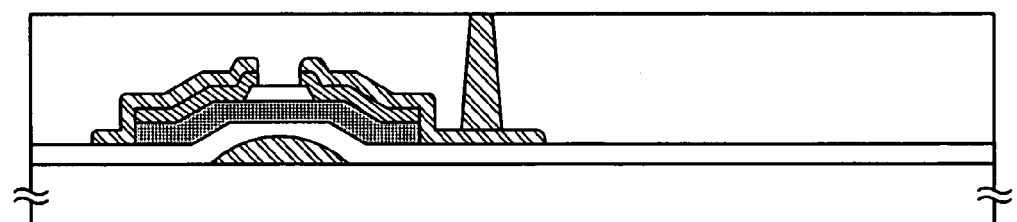
Figure 11D:
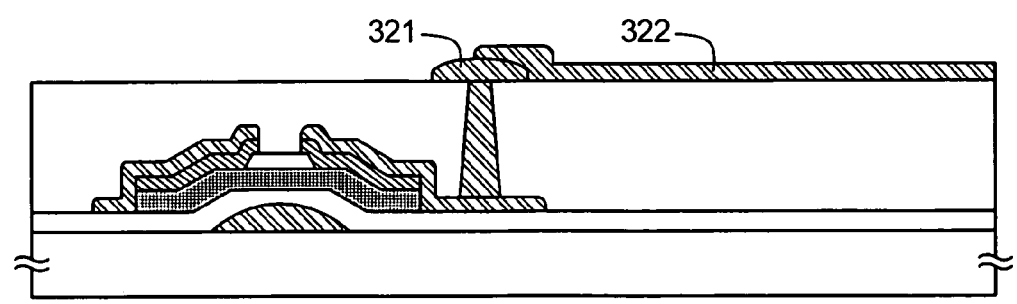

Then, the insulator 320 is etched to expose the electric conductor 319 (FIG. 11C). At the time, the insulator 320 is etched to expose a top surface of the electric conductor 319. Then, electric conductors 321 and 322 are formed to be in contact with the exposed top surfaces of electric conductor 319. Note that the electric conductor 322 is equivalent to a pixel electrode, and the aperture ratio can be increased by forming it on the insulator 320. Through the above described steps, upper and lower patterns can be connected by providing the electric conductor 319 functioning as a pillar for connecting with the electric conductor 321, on electric conductor 318. The present invention having the above described steps can make upper and lower patterns connect to each other without forming a contact hole.

In the above description, an N type semiconductor is exemplified as a semiconductor including one conductivity type impurity. The present invention is not limited to the mode using an N type semiconductor as a semiconductor including one conductivity type impurity, and may employ another type semiconductor.

This embodiment mode can be applied to Embodiment Mode 1.

[Embodiment Mode 3]

A method for manufacturing a semiconductor device in which a multilayer wiring is manufactured according to the present invention is described with reference to FIG. 5.

Figure 5:
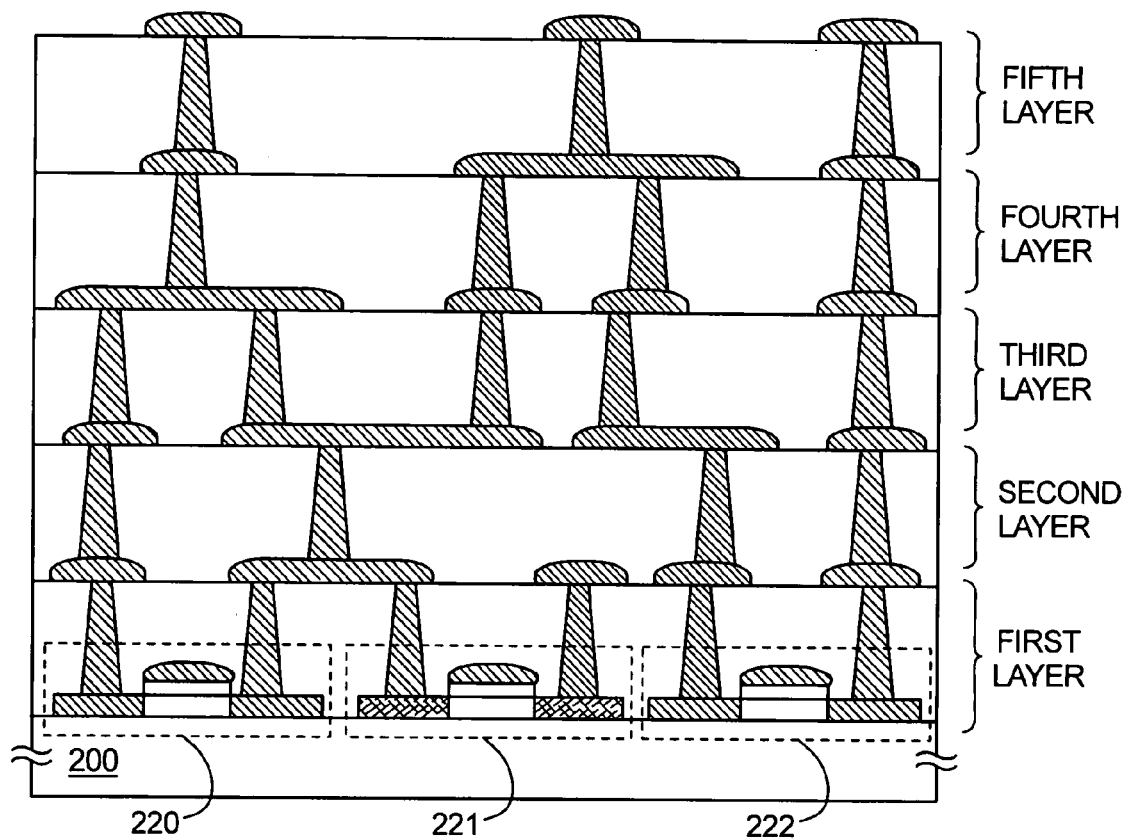
FIG. 5 shows a method for manufacturing of a semiconductor device of the present invention, specifically, a method for manufacturing of a semiconductor device having a multilayer wiring;.

FIG. 5 is a cross-sectional view of a semiconductor device in which five layers are formed over a substrate 200. A case where thin film transistors 220 to 222 are formed in the first layer, and wirings are formed in the second to fifth layers is shown. The present invention is applied in manufacturing an electric conductor functioning as a pillar for connecting upper and lower patterns in all layers.

A semiconductor device including the multilayer wirings is preferably used for a function circuit in which a large number of semiconductor elements such as a CPU are required to be incorporated. In the case of not forming the multilayer wiring, a wiring is required to be manufactured in the same layer as the gate electrode, or the source/drain wiring of a semiconductor element (here, thin film transistor) which is formed in the first layer. Accordingly, the wiring is required to be led out, therefore the yield gets worse by just that much or the arrangement area becomes large. In this case, miniaturization of a semiconductor device cannot be realized, except by reducing the size of the semiconductor element. On the other hand, when a multilayer wiring is manufactured according to a method for manufacturing a wiring of the present invention, upper and lower patterns can be connected to each other without forming a contact hole; therefore the yield can be improved. And higher integration becomes possible by narrowing the width between elements in the first layer, and a wiring in an upper layer thereof can be manufactured. Therefore, the steep miniaturization can be realized. Because the wiring is not required to be further led out, lower resistance can be obtained and higher speed can be realized.

It is preferable that an organic material having low dielectric constant is used for an insulator between an upper layer and a lower layer, since excessive film-thinning or disconnection in a step portion is not caused when a conductor is formed later, because of the favorable planarity. In addition, since a wiring capacity is reduced, it is possible to provide a semiconductor device that can realize high performance and high function.

[Embodiment 1]

Figure 6A:
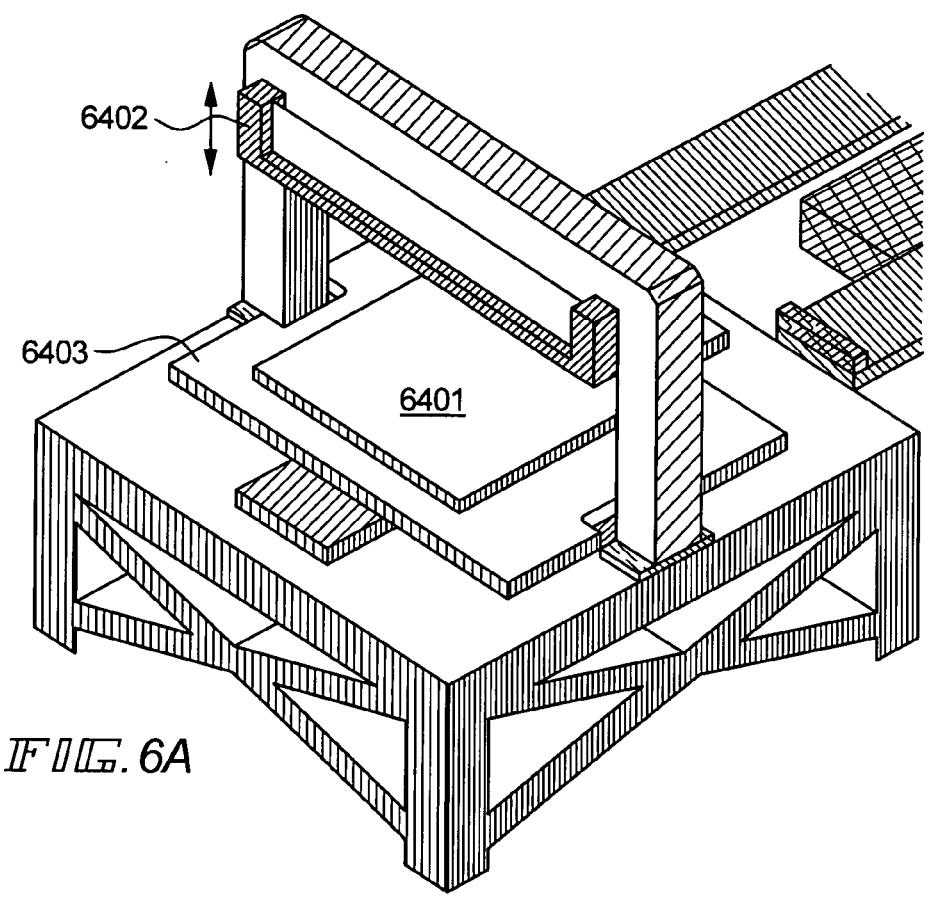
FIGS. 6A and 6B show an example of a droplet discharging device that is used in manufacturing a wiring and a semiconductor device of the present invention.
Figure 6B:
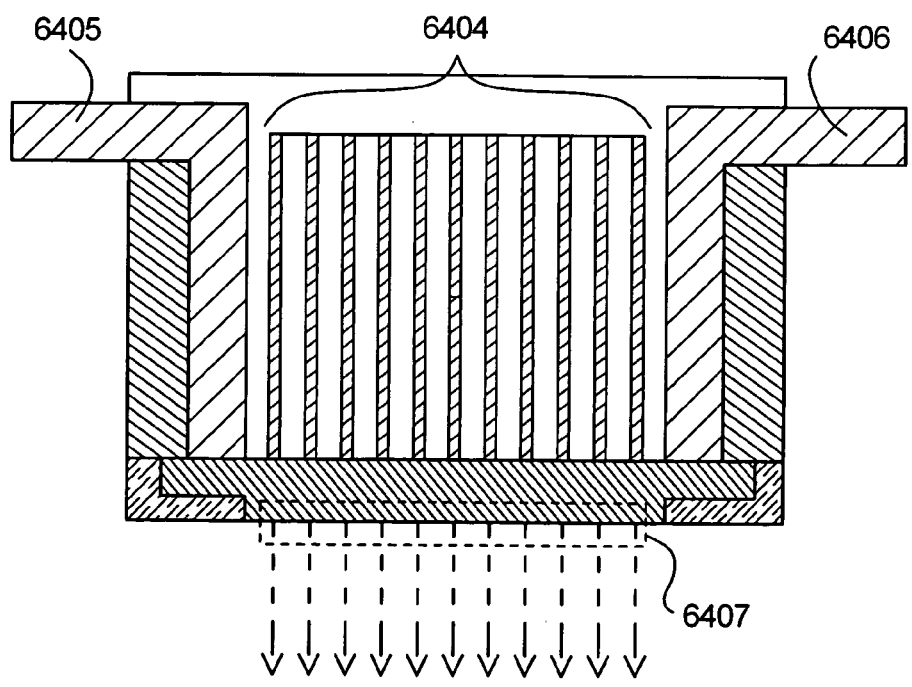

An example of a droplet discharging device that is used in manufacturing a wiring and a semiconductor device of the present invention is described with reference to FIGS. 6A and 6B. First, a structure of the droplet discharging device is described briefly with reference to FIG. 6A. A droplet discharging unit (not shown), equipped with a head in which a plurality of nozzles are arranged in a uniaxial direction, a controller and a CPU (not shown) controlling the droplet discharging unit, a stage 6403 which fixes a substrate 6401 and moves in a XYθ direction, and the like are given as indispensable components of this device. Reference numeral 6402 denotes a fixator (a frame) for setting the droplet discharge unit has a structure in which the droplet discharge unit shown in FIG. 6B is set. The stage 6403 has also a function of fixing the substrate 6401 with vacuum chuck or the like. Then, a pattern is formed by discharging a composition toward the substrate 6401 from an outlet of each nozzle of the droplet discharging unit.

The stage 6403 and the droplet discharging unit are controlled by the CPU through the controller. An imaging device such as a CCD camera (not shown) is also controlled by the CPU. The imaging device detects a position of a marker and supplies the detected information to the CPU. In forming a pattern, the droplet discharging unit may be moved and the stage 6403 may be moved while fixing the droplet discharging unit. Note that when the droplet discharging unit is moved, it is necessary to take into account acceleration of a composition, a distance between a nozzle equipped with the droplet discharging unit and an object to be treated, and the environment.

Besides, although not shown, in order to improve the accuracy of landing of a discharged composition, as an accompanying component, a mechanism for moving the droplet discharging unit up and down, a control unit for it, and the like may be provided. Accordingly, depending on the property of a composition to be discharged, the distance between a head and the substrate 6401 can be changed. In addition, a clean unit or the like for supplying clean air and reducing dust in a work area may be provided. Although not shown, a unit for heating a substrate or a unit for measuring property values such as temperature and pressure, or the like may be provided if necessary, which can be controlled collectively with a control unit which is provided outside of a casing. Furthermore, when the control unit is connected to a production control system or the like with a LAN cable, a wireless LAN, an optical fiber, or the like, it is possible to evenly control a production process from outside, which results in improving productivity. In order to fasten drying of a discharged and landed composition, or to remove a solvent component of the composition, the droplet discharging unit may be operated under low pressure by evacuating.

FIG. 6B shows a droplet discharging unit. In FIG. 6B, reference numeral 6404 denotes a piezoelectric element, 6405 and 6406 denote fixators (frames) and are set in the fixator (frame) 6402 shown in FIG. 6A. Reference numeral 6407 denotes an outlet. In FIG. 6B, a case of so-called a piezo system using a piezoelectric element is shown; however, a system in which a solution is pushed out by using bubbles generated by heating a heat-generator may be used depending on a solution material. In this case, a piezoelectric element is replaced with a heat-generator. In addition, wettability of a solution with a solution chamber flow path, an extra solution chamber, a fluid resistive portion, a chamber for pressurizing, and an outlet for a solution is important for discharging a droplet. Therefore, a carbon film, a resin film or the like for adjusting the wettability with a material may be formed in each flow path. In addition, a wiring, a supply pipe, and the like are provided inside of the fixators (frames) 6405 and 6406. When the droplet discharging unit shown in FIG. 6B is attached to the device shown in FIG. 6A, the wiring is connected to a driver circuit for controlling a piezoelectric element, and the supply pipe is connected to a tank filled with a composition.

[Embodiment 2]

Figure 7A:
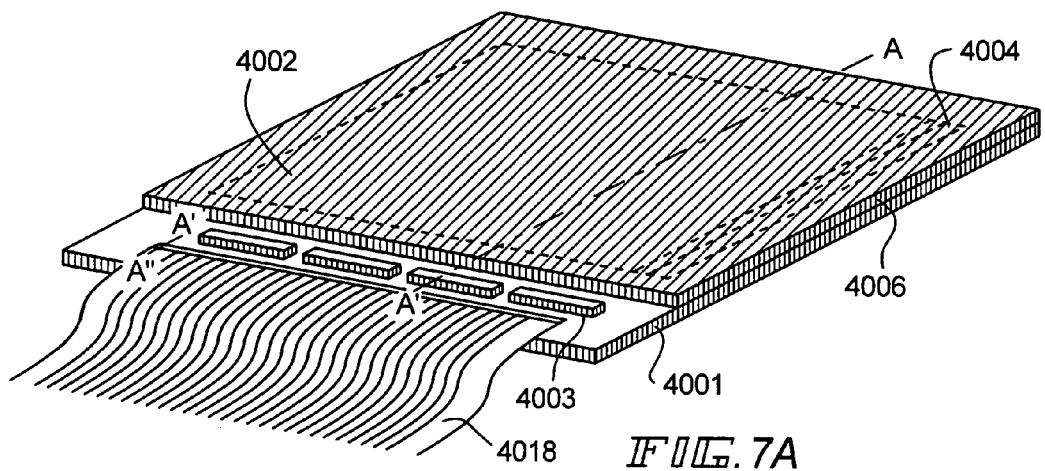
FIGS. 7A to 7C are a top view and cross-sectional views of a panel which is one mode of a semiconductor device to which the present invention is applied.
Figure 7B:
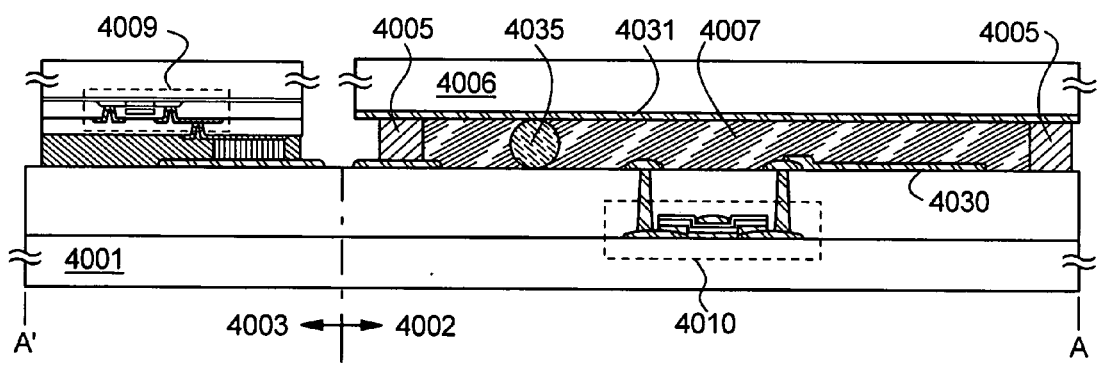
Figure 7C:
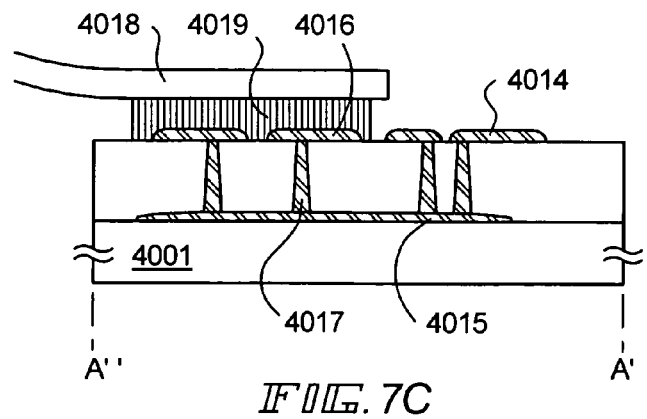

This embodiment describes an appearance of a panel which is one mode of a semiconductor device which the present invention is applied to with reference to FIGS. 7A to 7C. FIG. 7A is a top view of the panel in which a pixel portion 4002 and a scanning line driver circuit 4004 formed on a first substrate 4001 are sealed between a second substrate 4006 and the first substrate by a sealing material 4005, and FIG. 7B is a cross-sectional view taken along A–A' of FIG. 7A, and FIG. 7C is a cross-sectional view taken along A'–A" of FIG. 7A.

The sealing material 4005 is provided to surround the pixel portion 4002 and the scanning line driver circuit 4004 that are each formed on the first substrate 4001, in FIGS. 7A and 7B. The second substrate 4006 is provided over the pixel portion 4002 and the scanning line driver circuit 4004. Therefore, the pixel portion 4002 and the scanning line driver circuit 4004 are sealed together with a liquid crystal 4007 by the first substrate 4001, the sealing material 4005 and the second substrate 4006. A signal line driver circuit 4003 that is formed from a polycrystalline semiconductor on a separately prepared substrate is mounted on an area that is different from the area surrounded by the sealing material 4005 over the first substrate 4001.

This embodiment describes an example in which the signal line driver circuit 4003 having a transistor using a polycrystalline semiconductor is attached to the first substrate 4001, but a signal line driver circuit may be formed with a transistor using a single crystal semiconductor and attached. FIG. 7B exemplifies a transistor 4009 formed from a polycrystalline semiconductor included in the signal line driver circuit 4003. Further, this embodiment shows an example in which the signal line driver circuit 4003 is formed separately and mounted on the first substrate 4001, but this embodiment is not limited to this structure. A scanning line driver circuit may be formed separately and mounted, or only a portion of a signal line driver circuit or a scanning line driver circuit may be separately formed and mounted.

The pixel portion 4002 and the scanning line driver circuit 4004 formed over the first substrate 4001 have a plurality of transistors, and FIG. 7B exemplifies a transistor 4010 included in the pixel portion 4002. This transistor 4010 is a transistor in which an amorphous semiconductor is used as a channel portion. A liquid crystal element is a portion where a pixel electrode 4030 electrically connected to the transistor 4010, an opposite electrode 4031 that is formed over the second substrate 4006 and a liquid crystal 4007 are overlapped with one another. A spherical spacer 4035 is provided to control the distance (cell gap) between the pixel electrode 4030 and the opposite electrode 4031. As shown in FIG. 7C, various types of signals and electric potentials to be supplied to the signal line driver circuit 4003 formed separately and the scanning line driver circuit 4004 or the pixel portion 4002 are supplied from a connection terminal 4016, through leading wirings 4014 and 4015, and an electric conductor 4017 functioning as a pillar. The connecting terminal 4016 is electrically connected to a terminal of an FPC 4018 via an anisotropic conductive film 4019.

The present invention is applied in manufacturing a wiring constituting a transistor 4010 or in manufacturing the electric conductor 4017 functioning as a pillar. Note that the above mentioned panel may have an orientation film, a polarizing plate, a color filter or a shielding film, although not shown. Although the case where a liquid crystal element is used as a display element is shown, another display element such as a self-luminous element may be applied.

[Embodiment 3]

Figure 8A:
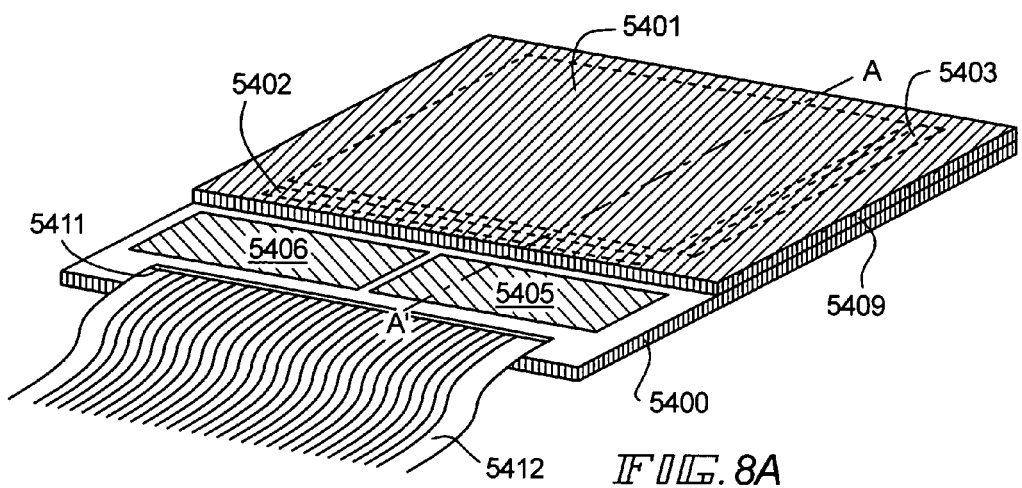
FIGS. 8A and 8B are a top view and a cross-sectional view of a panel which is one mode of a semiconductor device to which the present invention is applied.
Figure 8B:
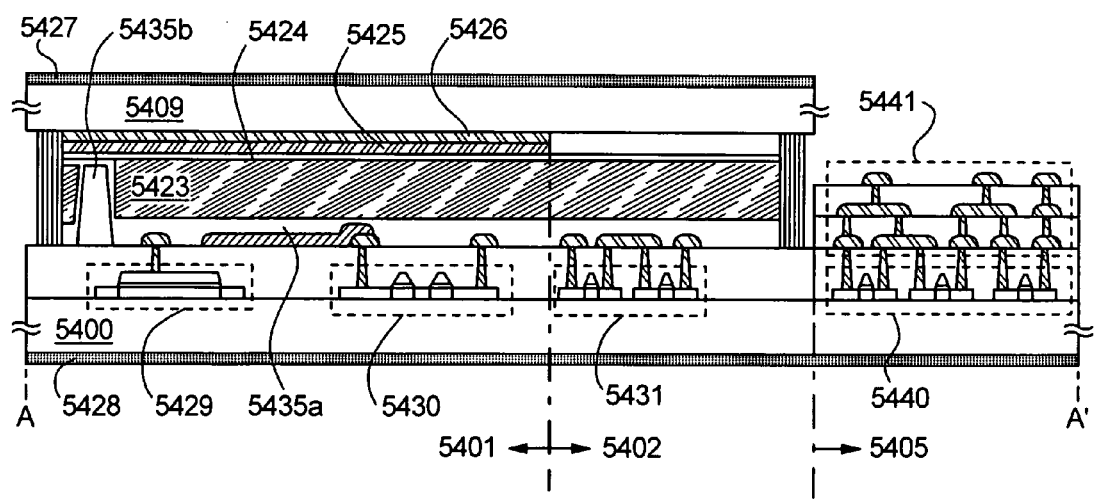

This embodiment describes an appearance of a panel that is one mode of a semiconductor device to which the present invention is applied with reference to FIGS. 8A and 8B. Specifically, a panel in which a pixel portion, a driver circuit for controlling the pixel portion, a memory and a CPU are mounted on the same surface, is described with reference to FIGS. 8A and 8B. FIG. 8A is a top view of the panel and FIG. 8B is a cross-sectional view taken along A–A' of FIG. 8A.

FIG. 8A shows an appearance of the panel. The panel is equipped with a pixel portion 5401 in which plural pixels are arranged in matrix form over a glass substrate 5400, a signal line driver circuit 5402 and a scanning line driver circuit 5403 in the periphery of the pixel portion 5401. A memory 5406 corresponding to a VRAM (video random access memory), a RAM or a ROM and a CPU 5405 is provided over the substrate 5400. Further, an input terminal portion 5411 for supplying a signal for controlling the signal line driver circuit 5402 and the scanning line driver circuit 5403, the memory 5406 and the CPU 5405 is provided over the substrate 5400. A signal such as a video signal is supplied to the input terminal portion 5411 via an FPC 5412 from an external circuit. A sealing material (not shown) is provided to surround the pixel portion 5401, the signal line driver circuit 5402 and the scanning line driver circuit 5403, and the substrate 5400 and an opposite substrate 5409 are attached by the sealing material. The opposite substrate 5409 may be provided only over the pixel portion 5401 and the signal line driver circuit 5402 and the scanning line driver circuit 5403, or may be provided over the entire surface. However, it is preferable that a heat sink is provided to be in contact with the CPU 5405 that might generate fever.

FIG. 8B is a cross-sectional view of the panel in which the pixel portion 5401, the signal line driver circuit 5402 and the CPU 5405 is provided over the substrate 5400. The pixel portion 5401 includes a transistor 5430 and a capacitor element 5429, the signal line driver circuit 5402 includes an element group 5431 comprising a CMOS circuit etc., and the CPU 5405 includes an element group 5440 and a wiring group 5441. A spacer 5435b is provided between the substrate 5400 and the opposite substrate 5409. An orientation film 5435a exposed to a rubbing treatment, a liquid crystal layer 5423, an orientation film 5424, an opposite electrode 5425 and a color filter 5426 are provided over the pixel portion 5401. Polarizing plates 5428 and 5427 are attached to the substrate 5400 and the opposite substrate 5409. The present invention is applied in manufacturing a wiring constituting the transistor 5430, the capacitor element 5429, the element groups 5431 and 5440 or in manufacturing a wiring constituting the wiring group 5441.

An element forming a circuit over the substrate 5400 is formed from an element that uses a polycrystalline semiconductor (polysilicon) having more favorable properties such as mobility than an amorphous semiconductor as a channel portion, and therefore, monolithic on the same surface can be realized. Like this, a panel in which a function circuit such as a CPU or a memory can be integrated additionally over the same substrate 5400 as a pixel portion and a driver circuit is referred to as a system-on-panel, and multifunction of a system can be obtained. The panel having the above described structures can achieve miniaturization, lightweight, thinning since the number of external ICs to be connected is reduced. It is extremely effective that the panel is applied to a portable terminal that becomes rapidly common recently. Note that the panel may have a light shielding film or the like, although not shown. Although the case where a liquid crystal element is used as a display element is shown, another display element such as a self-luminous element may be applied.

[Embodiment 4]

Examples of electronic devices formed according to the present invention include a video camera, a digital camera, a goggle type display, a navigation system, an audio player such as a car audio, a laptop personal computer, a game machine, a portable information terminal (such as a mobile computer, a cellular telephone, a portable game machine or an electronic book), an image reproducing device provided with recording medium such as a game machine for home use (typically, a device provided with a display that can reproduce a recording medium such as DVD (digital versatile disc) and display the image) and the like. Practical examples of the electronic devices are shown in FIGS. 9A to 9C and 10A to 10F.

Figure 9A:
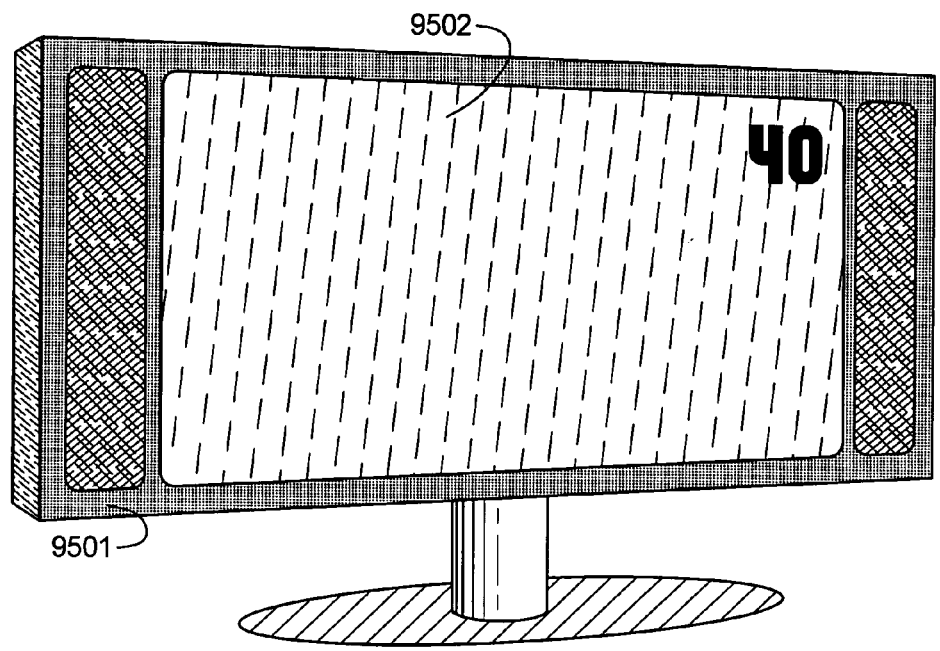
FIGS. 9A to 9C show electronic devices to which the present invention is applied.
Figure 9B:
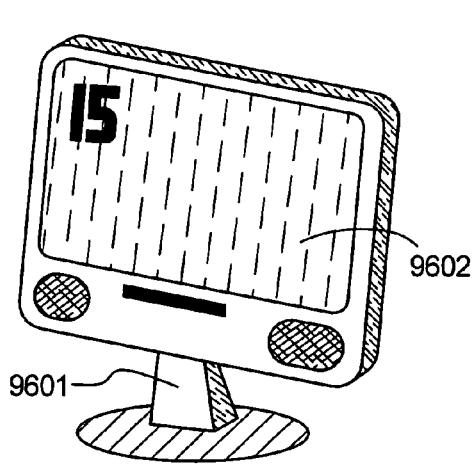
Figure 9C:
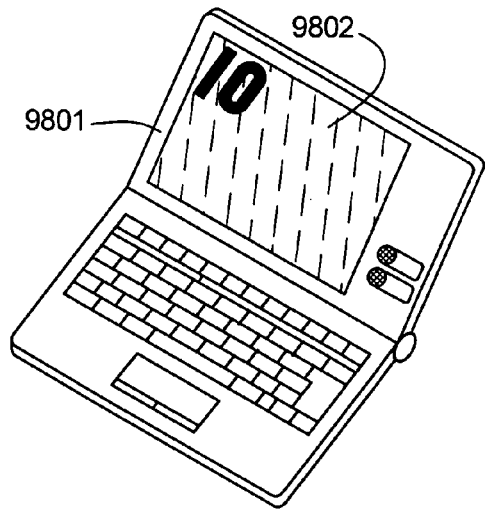

FIG. 9A shows a 40-inch large liquid crystal television that includes a casing 9501, a display portion 9502 and the like. FIG. 9B shows a monitor that is used together with a personal computer and that includes a casing 9601, a display portion 9602 and the like. FIG. 9C shows a laptop personal computer that includes a casing 9801, a display portion 9802 and the like. The present invention is applied in manufacturing the panels each including the display portions 9502, 9602 and 9802, and particularly, in manufacturing a wiring to be connected to a semiconductor element typified by a thin film transistor. Like the electronic devices shown in FIGS. 9A to 9C, the panels each including the display portions 9502, 9602 and 9802 that are 10 inches or larger in size, are preferably formed from a thin film transistor (a-SiTFT) forming a channel portion with an amorphous semiconductor in terms of cost or a process. An inexpensive electronic device can be provided, since a crystallization step in manufacturing steps can be omitted by using an amorphous semiconductor. In addition, when a display portion is formed from an a-SiTFT, a liquid crystal element is preferably applied as a display element because of the response speed. Note that a panel forming the display portion by an a-SiTFT is as shown in FIGS. 7A to 7C, and thus, the drawings of FIGS. 7A to 7C may be referred.

FIG. 10A shows a portable terminal that includes a main body 9101, a display portion the 9102 and the like. FIG. 10C shows a PDA including a main body 9201, a display portion 9202 and the like. FIG. 10D shows a goggle type display including a main body 9301, a display portion 9302 and the like. FIG. 10E shows a portable game machine including a main body 9401, a display portion 9402 and the like. FIG. 10F shows a digital video camera including display portions 9701 and 9702 and the like. FIG. 10B is an example of the panel including the display portion 9102. The display portion 9102 is integrated with a driver circuit 9104, and a function circuit 9103 such as a CPU or a memory on the panel. Like this, an electronic device having a panel in which a function circuit is integrated as well as a driver circuit can achieve miniaturization, lightweight, thinning and has an effective structure for a portable terminal, since the number of external ICs to be connected can be reduced. Therefore, it is preferable that a driver circuit or a function circuit is integrated on respective panels including the display portions 9202, 9302, 9402, 9701 and 9702, in addition to the panel including the display portion 9102. The present invention is applied in manufacturing the respective panels including the display portions 9102, 9202, 9302, 9402, 9701 and 9702, and particularly, in manufacturing a wiring to be connected to a semiconductor element typified by a thin film transistor. In addition, the present invention is applied in manufacturing a driver circuit or a function circuit integrated on the respective panels, specifically, in manufacturing a wiring to be connected to a semiconductor element or a multilayer wiring. Note that a panel in which a driver circuit and a function circuit are integrated is as shown in FIGS. 8A and 8B, and thus, the drawings of FIGS. 8A and 8B may be referred. A thin film transistor forming a channel portion with a polycrystalline semiconductor (polysilicon) that has more favorable properties such as mobility than an amorphous semiconductor, is employed in order to realize monolithic by integrating the function circuit 9103 and the driver circuit 9104. In the above mentioned electronic devices, a self luminous type light emitting element is preferably used for a portable terminal such as a cellular telephone as a display element provided in a display portion. The self luminous type light emitting element does not need a backlight; therefore, thinning, miniaturization, lightweight can be further realized as compared with a liquid crystal element.

This application is based on Japanese Patent Application serial no. 2003-294021 filed in Japan Patent Office on 15$^{th}$, Aug., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A method for manufacturing a wiring, comprising the steps of:
   forming a first pattern over a substrate;
   forming a pillar on the first pattern by discharging a composition including a conductive material locally on the first pattern;
   forming an insulator to cover the pillar;
   etching the insulator to expose at least a top surface of the pillar; and
   forming a second pattern on the exposed top surface of the pillar.

2. The method for manufacturing a wiring according to claim 1, wherein the composition includes silver, gold, copper or indium tin oxide.

3. The method for manufacturing a wiring according to claim 1, wherein the insulator is etched by an etchback method or a CMP method.

4. The method for manufacturing a wiring according to claim 1, wherein the insulator is formed by discharging a composition including resin.

5. The method for manufacturing a wiring according to claim 1, wherein one or both of the first and the second patterns is/are formed by discharging a composition including a conductive material.

6. The method for manufacturing a wiring according to claim 1, wherein one or both of the first and the second patterns is/are formed by a photolithography step.

7. The method for manufacturing a semiconductor device according to claim 1, the semiconductor device is used for an electronic apparatus selected from the group consisting of a 40-inch large liquid crystal television, a monitor, a laptop personal computer, a portable terminal, a goggle type display, a portable game machine, and a digital video camera.

8. The method for manufacturing a wiring according to claim 1, wherein the pillar is an electric conductor.

9. A method for manufacturing a semiconductor device, comprising the steps of:
   forming a pillar on an impurity region included in a semiconductor by discharging a composition including a conductive material locally on the impurity region;
   forming an insulator to cover the pillar;
   etching the insulator to expose at least a top surface of the pillar; and
   forming a pattern on the exposed top surface of the pillar.

10. The method for manufacturing a semiconductor device according to claim 9, wherein the composition includes silver, gold, copper or indium tin oxide.

11. The method for manufacturing a semiconductor device according to claim 9, wherein the insulator is etched by an etchback method or a CMP method.

12. The method for manufacturing a semiconductor device according to claim 9, wherein the insulator is formed by discharging a composition including resin.

13. The method for manufacturing a semiconductor device according to claim 9, the semiconductor device is used for an electronic apparatus selected from the group consisting of a 40-inch large liquid crystal television, a monitor, a laptop personal computer, a portable terminal, a goggle type display, a portable game machine, and a digital video camera.

14. The method for manufacturing a semiconductor device according to claim 9, wherein the pillar is an electric conductor.

15. The method for manufacturing a semiconductor device according to claim 9, wherein the pattern includes a conductive material.

16. A method for manufacturing a semiconductor device, comprising the steps of:
   forming a first semiconductor including one conductivity type impurity over a first pattern;
   forming a second semiconductor over the first semiconductor including one conductivity type impurity;
   forming a first insulator over the second semiconductor;
   forming a second pattern by discharging a composition over the first insulator;
   patterning the first semiconductor including one conductivity type impurity, the second semiconductor and the first insulator simultaneously by using the second pattern as a mask, and thereafter, removing the second pattern;
   forming a pillar on the first pattern by discharging a composition including a conductive material locally on the first pattern;
   forming a second insulator to cover the pillar;
   etching the second insulator to expose at least a top surface of the pillar; and
   forming a third pattern on the exposed top surface of the pillar.

17. The method for manufacturing a semiconductor device according to claim 16, wherein the composition includes silver, gold, copper or indium tin oxide.

18. The method for manufacturing a semiconductor device according to claim 16, wherein the second insulator is etched by an etchback method or a CMP method.

19. The method for manufacturing a semiconductor device according to claim 16, wherein the second insulator is formed by discharging a composition including resin.

20. The method for manufacturing a semiconductor device according to claim 16, the semiconductor device is used for an electronic apparatus selected from the group consisting of a 40-inch large liquid crystal television, a monitor, a laptop personal computer, a portable terminal, a goggle type display, a portable game machine, and a digital video camera.

21. The method for manufacturing a semiconductor device according to claim 16, wherein the pillar is an electric conductor.

22. The method for manufacturing a semiconductor device according to claim 16, wherein the first pattern includes a conductive material.

23. The method for manufacturing a semiconductor device according to claim 16, wherein the second pattern includes an organic insulator.

24. The method for manufacturing a semiconductor device according to claim 16, wherein the third pattern includes a conductive material.

25. A method for manufacturing a semiconductor device, comprising the steps of:
   forming a first insulator over a semiconductor;
   forming a first pattern over the first insulator;
   adding an impurity into the semiconductor by using the first pattern as a mask;
   forming a pillar on an impurity region included in the semiconductor by discharging a composition including a conductive material locally on the impurity region;
   forming a second insulator to cover the pillar;
   etching the second insulator to expose at least a top surface of the pillar; and
   forming a second pattern on the exposed top surface of the pillar.

26. The method for manufacturing a semiconductor device according to claim 25, wherein the composition includes silver, gold, copper or indium tin oxide.

27. The method for manufacturing a semiconductor device according to claim 25, wherein the second insulator is etched by an etchback method or a CMP method.

28. The method for manufacturing a semiconductor device according to claim 25, wherein the second insulator is formed by discharging a composition including resin.

29. The method for manufacturing a semiconductor device according to claim 25, the semiconductor device is used for an electronic apparatus selected from the group consisting of a 40-inch large liquid crystal television, a monitor, a laptop personal computer, a portable terminal, a goggle type display, a portable game machine, and a digital video camera.

30. The method for manufacturing a semiconductor device according to claim 25, wherein the pillar is an electric conductor.

31. The method for manufacturing a semiconductor device according to claim 25, wherein the first pattern includes a conductive material.

32. The method for manufacturing a semiconductor device according to claim 25, wherein the second pattern includes a conductive material.

* * * * *